United States Patent
Saiki

Patent Number: 5,376,212
Date of Patent: Dec. 27, 1994

[54] REDUCED-PRESSURE PROCESSING APPARATUS

[75] Inventor: Kazuyoshi Saiki, Yamanashi, Japan

[73] Assignee: Tokyo Electron Yamanashi Limited, Niraaki, Japan

[21] Appl. No.: 19,277

[22] Filed: Feb. 18, 1993

[30] Foreign Application Priority Data

Feb. 18, 1992 [JP] Japan .................................. 4-69718

[51] Int. Cl.⁵ .......................................... H01L 21/00
[52] U.S. Cl. ............................... 156/345; 204/298.25; 204/298.35; 115/719; 414/217; 414/DIG. 1; 414/DIG. 5
[58] Field of Search ............................. 156/345, 643; 204/298.25, 298.26, 298.35; 118/719; 414/217, DIG. 1, DIG. 5

[56] References Cited

U.S. PATENT DOCUMENTS

| | | | |
|---|---|---|---|
| 4,785,962 | 11/1988 | Toshima | 220/260 |
| 4,825,808 | 5/1989 | Takahashi et al. | 118/719 |
| 4,851,101 | 7/1989 | Hutchinson | 204/298.25 X |
| 4,908,095 | 3/1990 | Kagatsume et al. | 156/643 |
| 5,217,501 | 6/1993 | Fuse et al. | 118/719 X |

FOREIGN PATENT DOCUMENTS

| | | | |
|---|---|---|---|
| 62-57378 | 12/1987 | Japan . | |
| 303060 | 12/1988 | Japan | 204/298.25 |
| 9010949 | 9/1990 | WIPO . | |

*Primary Examiner*—Thi Dang
*Attorney, Agent, or Firm*—Oblon, Spivak, McClelland, Maier & Neustadt

[57] ABSTRACT

A reduced-pressure processing apparatus which comprises a wafer table, two processing chambers, and three load-locking chambers. The wafer table temporarily supports a workpiece. In the first processing chamber, a first process is performed on a workpiece under a reduced pressure, In the second processing chamber, a second process is performed on the workpiece under a reduced pressure. The first load-locking chamber is connected to the first processing chamber, for allowing to be pneumatically disconnected from the first processing chamber, and allowing a passage of a workpiece into and from the first processing chamber and to and from the temporary holding means. The second load-locking chamber is connected to the second processing chamber, for allowing to be pneumatically disconnected from the second processing chamber, and allowing a passage of a workpiece into and from the second processing chamber and to and from the temporary supporting means. The third load-locking chamber is located between the first and second processing chambers and connected thereto, for allowing to be pneumatically disconnected from the first and second processing chambers, and allowing a passage of a workpiece into and from the first and second processing chambers and to and from the temporary holding means.

14 Claims, 5 Drawing Sheets

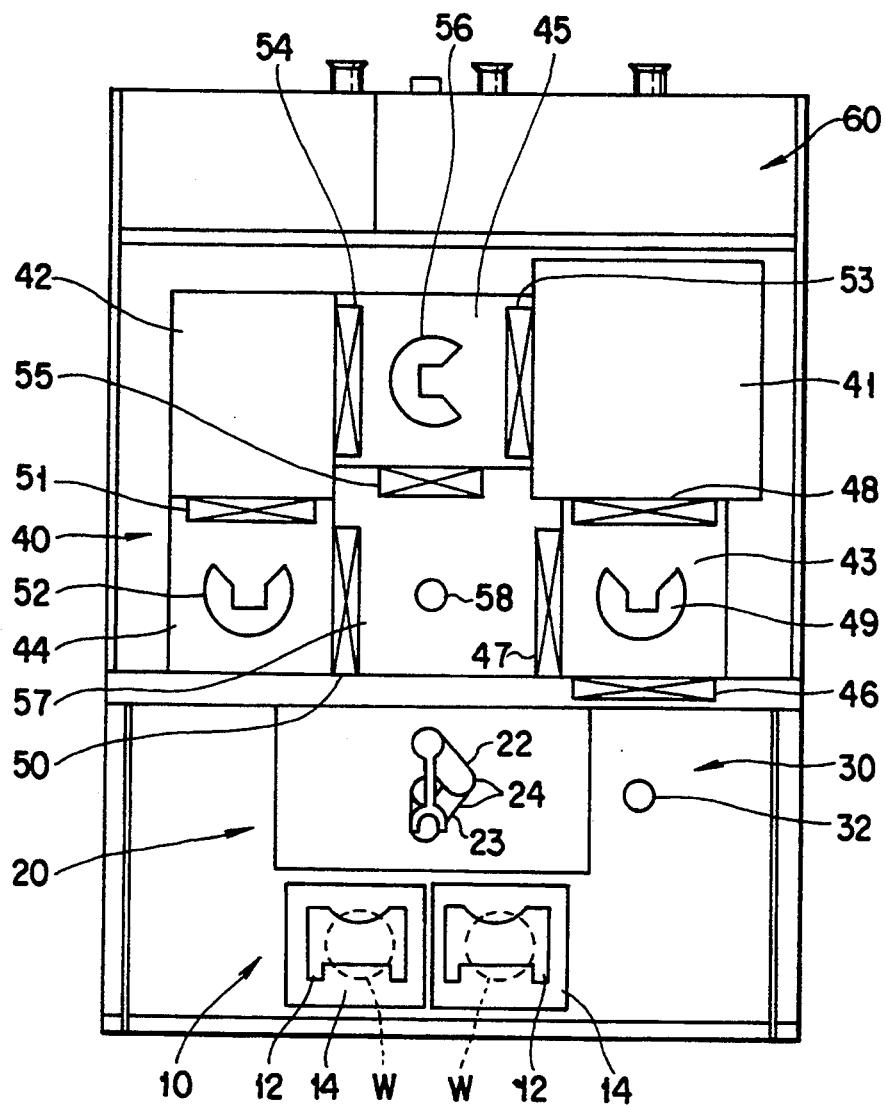
F I G. 1

REDUCED-PRESSURE PROCESSING APPARATUS

BACKGROUND OF THE INVENTION

1. Field of the Invention

The present invention relates to a reduced-pressure processing apparatus which can perform two reduced-pressure processes continuously or only one of these processes selectively.

2. Description of the Related Art

A reduced-pressure processing apparatus is known which is designed to perform etching, ashing, film-forming and the like under a reduced pressure. The apparatus comprises a processing chamber and two load-locking chambers connected to both sides of the processing chamber. A workpiece is processed under a reduced pressure in the processing chamber. The load-locking chambers are used to shield the processing chamber from the atmosphere while a workpiece is being moved into, and removed from, the processing chamber.

A reduced-pressure processing apparatus of another type called "in-line type" is known (see U.S. Pat. No. 4,825,808), which is designed to perform different processes continuously. The in-line type reduced-pressure processing apparatus comprises a plurality of processing chambers and a plurality of load-locking chambers. The processing chambers are arranged in a row. Each load-locking chamber, except two, is located between and connected to any two adjacent processing chambers. The remaining two load-locking chambers are connected to the first processing chamber and the last processing chamber, respectively.

A reduced-pressure processing apparatus of another type called "multi-chamber type" is also known (see U.S. Pat. No. 4,785,962), which is designed to perform different processes continuously, as well. The multi-chamber type reduced-pressure processing apparatus comprises a hollow cylindrical load-locking chamber and a plurality of processing chambers arranged around the load-locking chamber and connected thereto.

In each of the three types of reduced-pressure processing apparatuses, each processing chamber is connected to a load-locking chamber by means of an open/close mechanism such as a gate valve.

The apparatuses of three types described above are disadvantageous in the following respects.

In the apparatus of the first-mentioned type, a workpiece cannot be continuously subjected to two or more processes. To continuously subject the workpiece to two processes, for example, two apparatuses of this type must be used in combination. If two or more apparatuses are used for this purpose, any common component of each apparatus cannot be utilized for any other apparatus, too. Further, the use of two or more apparatuses is not economical and requires a large floor space.

The in-line type apparatus must usually perform as many processes as the processing chambers it has. In other words, a workpiece cannot be removed from the apparatus into the atmosphere before it is processed in all processing chambers. The use of the apparatus is inevitably limited.

As has been indicated, the multi-chamber type apparatus has one load-locking chamber and two or more processing chambers arranged parallel to each other and connected to the load-locking chamber. Hence it is possible to perform a process in a selected one of the processing chambers or more processes in selected ones of the processing chambers, if the sequence control is altered appropriately. The multi-chamber type apparatus has a drawback, however. Most apparatuses of the multi-chamber type has four processing chambers at the least, which are connected to the single load-locking chamber. The load-locking chamber therefore has a great volume. It takes much time to evacuate the load-locking chamber, particularly when only one or two processes are performed on a workpiece, inevitably decreasing the process throughput. A multi-chamber type apparatus having only processing chambers occupies a floor space which is large for the number of the processing chambers, since its load-locking chamber has a great volume in most cases.

SUMMARY OF THE INVENTION

An object of the present invention is to provide a reduced-pressure processing apparatus in which a work-piece can be continuously subjected to two reduced-pressure processes, to only one of these processes selectively.

Another object of the invention is to provide a reduced-pressure processing apparatus which occupies a minimum floor space in a clean room whose unit space is very expensive.

According to an aspect of the invention, there is provided a reduced-pressure processing apparatus which comprises: a first processing chamber in which a first process is performed on a workpiece under a reduced pressure; a second processing chamber in which a second process is performed on the workpiece under a reduced pressure; a first load-locking chamber connected to the first processing chamber, for allowing to be pneumatically disconnected from the first processing chamber, and allowing a passage of a workpiece into and from the first processing chamber and a space other than the first and second processing chambers; a second load-locking chamber connected to the second processing chamber, for allowing to be pneumatically disconnected from the second processing chamber, and allowing a passage of a workpiece into and from the second processing chamber and into and from a space other than the first and second processing chambers and the first load-locking chamber; and a third load-locking chamber located between the first and second processing chambers and connected thereto, for able allowing to be pneumatically disconnected from the first and second processing chambers, and allowing a passage of a workpiece into and from the first and second processing chambers and into and from a space other than the first and second processing chambers and the first and second load-locking chambers.

According to another aspect of the invention, there is provided a reduced-pressure processing apparatus which comprises: temporary supporting means for temporarily supporting a workpiece; a first processing chamber in which a first process is performed on a workpiece under a reduced pressure; a second processing chamber in which a second process is performed on the workpiece under a reduced pressure; a first load-locking chamber connected to the first processing chamber, for allowing to be pneumatically disconnected from the first processing chamber, and allowing a passage of a workpiece into and from the first processing chamber and to and from the temporary supporting means; a second load-locking chamber connected to the second processing chamber, for allowing to be pneumatically disconnected from the second processing chamber, and allowing a passage of a workpiece into and from the second processing chamber and to and from the temporary supporting means; and a third load-locking chamber located between the first and second processing chambers and connected thereto, for allowing to be pneumatically disconnected from the first and second processing chambers, and allowing a passage of a workpiece into and from the first and second processing chambers and to and from the temporary supporting means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic plan view showing a reduced-pressure processing apparatus according to an embodiment of the present invention;

DETAILED DESCRIPTION OF THE PREFERRED EMBODIMENTS

Figure 2:
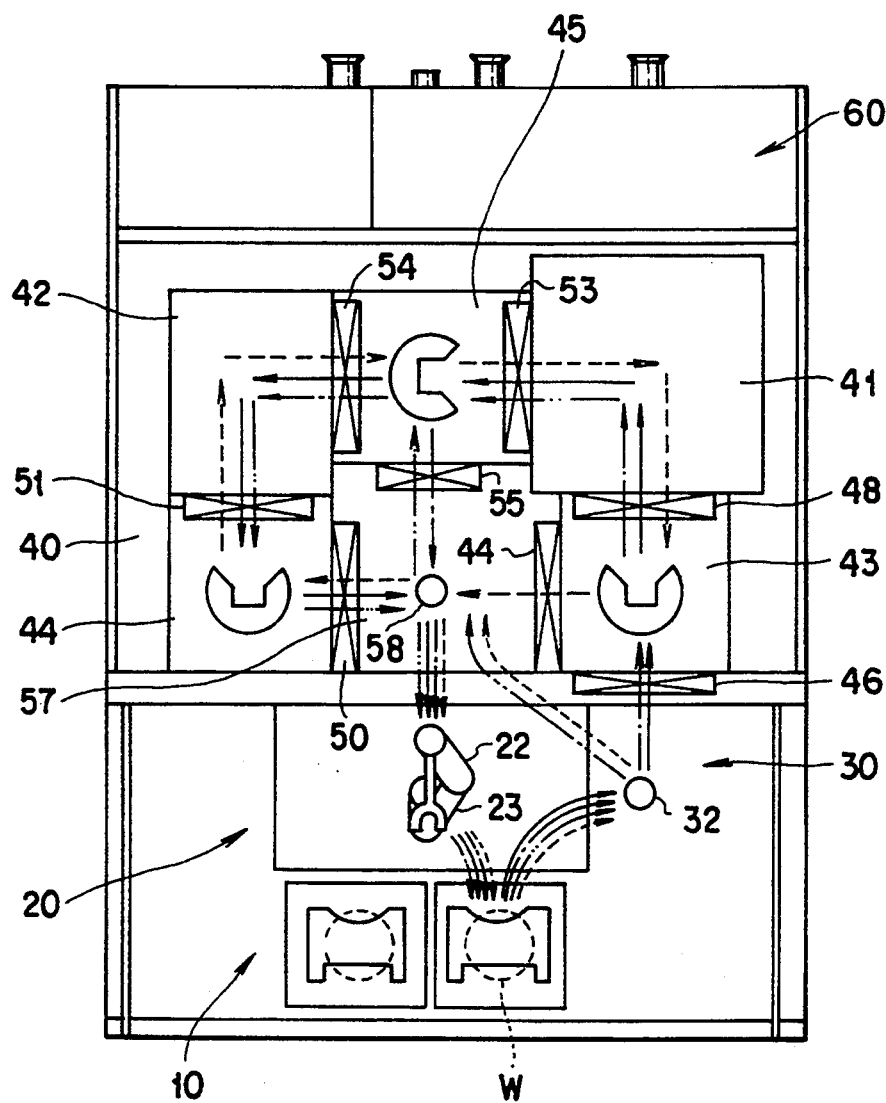
FIG. 2 is also a plan view, explaining the operation the apparatus shown in FIG. 1.

Preferred embodiments of this invention will now be described in detail, with reference to the accompanying drawings.

FIG. 1 is a schematic plan view showing a reduced-pressure processing apparatus according to a first embodiment of the invention. The apparatus comprises a storage section 10 for storing workpieces, for example, semiconductor wafers W, a transport section 20 for transporting wafers W to and from the storage section 10, an alignment section 30 for aligning each wafer W transported by the section 20, a processing section 40 for processing the wafer w aligned by the section 30, and a gas/power unit 60 for supplying gas and electric power to the processing section 40.

The storage section 10 can contain a plurality of wafer cassettes 12 (for example, two cassettes as is shown in FIG. 1). The wafer cassettes 12 are designed to hold semiconductor wafers W (for example, 25 wafers) horizontally, one above another, at predetermined intervals. The wafer cassettes 12 are mounted on cassette tables 14, respectively. The tables 14 can be moved up and down by independent lift mechanisms (not shown).

The transport section 20 comprises a multi-joint robot 22 designed to transport wafers w among the storage section 10, the alignment section 30, and the processing section 40. The robot 22 comprises a transport arm 23 and other arms 24. The transport arm 23 has a wafer-holding device (for example, a vacuum suction mechanism) at its tip, and is connected to the first of the other arms 24. The arms 24 are connected together, each having its trailing end coupled to the leading end of the next one. The robot 22 may be of the known type disclosed in, for example, U.S. Pat. No. 4,908,095.

The alignment section 30 has a wafer chuck 32 (for example, vaccum chuck) for holding a wafer w at a predetermined position. The wafer chuck 32 can be rotated and moved both vertically and horizontally, by means of a drive mechanism (not shown). A sensor (not shown), such as a photo sensor, is located near the wafer chuck 32, for detecting the edge of a semiconductor wafer w held by the chuck 32. Upon detecting the edge of a wafer W, the sensor outputs a signal. The signal is supplied to the drive mechanism. In response to the signal, the drive mechanism moves the wafer chuck whereby the wafer W is moved to the predetermined position and aligned there, thus achieving, for example, the aligning of the orientation flat of the wafer W.

The processing section 40 comprises two processing chambers 41 and 43, three load-locking chambers 43, 44 and 45, and a transfer stage 57. In the first processing chamber 41, a first process is performed on a wafer W under a reduced pressure. In the second processing chamber 42, a second process is performed on the wafer W under a reduced pressure. The first load-locking chamber 43 is connected to the first processing chamber 41 and can pneumatically disconnect the chamber 41 from the atmosphere. The second load-locking chamber 44 is connected to the second processing chamber 42 and can pneumatically disconnect the chamber 42 from the atmosphere. The third load-locking chamber 45 is located between, and connected to, the first and second processing chambers 41 and 42, for pneumatically disconnecting the first and second processing chambers 41 and 42 from each other, the first processing chamber 41 from the atmosphere, and the second processing chamber 42 from the atmosphere. The transfer stage 57 is used to support a wafer W temporarily while the wafer W is being transferred among the processing chambers 41 and 42 and the load-locking chambers 43, 44 and 45.

In each of the processing chambers 41 and 42, various processes, such as etching, ashing, and film-forming, can be performed on a wafer W in a desired gas atmosphere under a reduced pressure. The chambers 41 and 42 can be evacuated by means of an evacuation mechanism such as a rotary pump. Inert gases such as $N_2$ and Ar can be introduced as purge gases into each processing chamber by means of a purge mechanism.

As has been described, the first and second load-locking chambers 43 and 44 can pneumatically disconnect the first and second processing chambers 41 and 42, respectively, from the atmosphere, whereas the third load-locking chamber 45 can pneumatically disconnect the first and second processing chambers 41 and 42 from each other, the first processing chamber 41 from the atmosphere, and the second processing chamber 42 from the atmosphere. Hence, the load-locking chambers 43, 44, and 45 enable the processing chambers 41 and 42 to remain airtight and maintain desired gas atmospheres in them, while a wafer W is being transported among the processing chambers and the atmosphere.

The first load-locking chamber 43 has three open/close mechanisms 46, 47 and 48 and a transport arm 49. The second load-locking chamber 44 has two open/close mechanisms 50 and 51 and a transport arm 52. The third load-locking chamber 45 has three open/close mechanisms 53, 54 and 55 and a transport art 56. Each load-locking chamber can be evacuated by an evacuation mechanism such as a vacuum pump. Also, inert gases such as $N_2$ and Ar can be introduced as purge gases into each load-locking chamber by means of a purge mechanism.

The transport arm 49 provided in the first load-locking chamber 43 is used to transport a wafer w among the alignment section 30, the first processing chamber 41, the first load-locking chamber 43, and the transfer stage 57. The transport arm 52 provided in the second load-locking chamber 44 is used to transport a wafer w among the second processing chamber 42, the second load-locking chamber 44, and the transfer stage 57. The transport arm 56 provided in the third load-locking chamber 45 is used to transport a wafer w among the first and second processing chambers 41 and 42, the third load-locking chamber 45, and the transfer stage 57. These transport arms 49, 52, and 56 may be of the type disclosed in, for example, U.S. Pat. No. 4,908,095.

An open/close mechanism is in a state of close usually, and in the state of open only when necessary to allow the passage of a wafer W into and from the load-locking chamber. Each load-locking chamber remains air-tight as long as all of its open/close mechanisms are in the state of close. While a wafer w is transported into or out of any load-locking chamber through one of the open/close mechanisms, both the first and second processing chambers 41 and 42 remain pneumatically disconnected from the atmosphere. Gate valves can be used as the open/close mechanisms, which may be of the type disclosed in, for example, U.S. Pat. No. 4,632,624.

The load-locking chambers 43, 44, and 45, described above, may be of the type disclosed in, for example, U.S. Pat. No. 4,433,951.

On the transfer stage 57 a wafer table 58 is mounted for temporarily supporting a semiconductor wafer W. The table 58 can be moved up and down by means of a drive mechanism (not shown).

As shown in FIG. 1, the first processing chamber 41, the third load-locking chamber 45, and the second possessing chamber 42 are arranged in a first line, the first processing chamber 41 and the first load-locking chamber 43 are arranged in a second line perpendicular to the first line, and the second processing chamber 43 and the second load-locking chamber 44 are arranged in a third straight line perpendicular to the first line. Arranged this way, the processing chambers 41 and 42 and the load-locking chambers 43, 44 and 45 surround the wafer mount 58 mounted on the transfer stage 57.

The operation of the reduced-pressure processing apparatus will be described, with reference to FIG. 1.

At first, all open/close mechanisms 46, 47, 48, 50, 51, 53, 54, and 55 are closed. An operator manipulates the hands of the multi-joint robot 22, thereby placing the wafer cassettes 12 (each containing 25 wafers W, for example) on the cassette tables 14, respectively. One of the tables 14 is moved up by the lift mechanism (not shown), until the cassette 12 reaches a predetermined position. The operator manipulates the robot 22 such that the transport arm 23 of the robot 22 is placed right under the wafer W to process. Then, the table 14 is lowered by the lift mechanism until the wafer W is pneumatically attracted to the transport arm 23.

Next, the transport arm 23 is moved, transporting the wafer W from the storage section 10 to the wafer chuck 32, which holds the semiconductor wafer W. The sensor located near the wafer chuck 32 detects the edge of the wafer W and outputs a signal, which is supplied to the drive mechanism. In response to the signal, the drive mechanism moves the chuck 32, centering the wafer W and, also, aligning the orientation flat thereof.

Further, interior of the first load-locking chamber 43 is purged with $N_2$ gas, raising the pressure in the chamber 43 to a value equal to or slightly greater than the atmospheric pressure. The open/close mechanism 46 is then opened. The transport arm 23 is moved, transporting the wafer W into the first load-locking chamber 43 through the open/close mechanism 46 now opened. The pressure in the chamber 43, which is higher than the atmospheric pressure, prevent contaminants from entering the chamber 43.

Thereafter, the open/close mechanism 46 is closed, and the first load-locking chamber 43 and the first processing chamber 41 are evacuated to substantially the same pressure of, for example, 50 to 500 Tort. The open/close mechanism 48 is then opened, and the transport arm 49 is moved, transporting the wafer W from the first load-locking chamber 43 into the first processing chamber 41. Once the wafer W is placed within the chamber 41, the open/close mechanism 48 is closed. Since the pressures in the chambers 41 and 43 are substantially the same, gas will not flow abruptly into either chamber when the open/close mechanism 48 is opened, and dust or impurities will scarcely disperse to contaminate the wafer W.

In the first processing chamber 41, a reduced-pressure process, e.g., etching, is performed on the semiconductor wafer W after the chamber 41 has been evacuated to, for example, about $10^{-4}$ Torr.

After the process has been carried out in the first processing chamber 41, interior of the chamber 41 is purged with $N_2$ gas, increasing the pressure there in to, for example, about 500 Torr. The open/close mechanism 53 is then opened. The arm 56 is moved, transporting the wafer W from the processing chamber 41 into the third load-locking chamber 45 through the open/close mechanism 53. After the wafer W is placed in the chamber 48, the open/close mechanism 53 is closed.

Next, the open/close mechanism 54 is opened, and the arm 56 is moved, transporting the wafer W from the third load-locking chamber 45 into the second processing chamber 42 through the open/close mechanism 54. After the wafer W is located in the chamber 42, the open/close mechanism 54 is closed.

The second chamber 42, now containing the wafer W, is evacuated to, for example, $10^{-3}$ Tort. Then, a reduced-pressure process, e.g., ashing, is performed on the semiconductor wafer W in the second processing chamber 42.

Since the wafer W is transported from the first processing chamber 41 to the second processing chamber 42 via the third load-locking chamber 45 located between the chambers 41 and 42, the wafer W is protected against cross-contamination. $Cl_2$ and $O_3$, if applied to perform etching and ashing in the processing chambers 41 and 42, respectively, do not contact at all since the third load-locking chamber 45 pneumatically disconnects the chambers 41, 42 from each other. Hence, $Cl_2$-$O_3$ cross-contamination, which would decrease the yield of processed wafers W, will not occur at all. The term "ashing" means a process of heating a wafer W in, for example, an ozone atmosphere, for the purpose of ashing any resist film unetched and thereby removing the resist film from the wafer W.

The cross-contamination can be more effectively prevented by two methods. The first method is to adjust the pressures in the third load-locking chamber 45 and the second processing chamber 42 after the wafer W has been transported from the first processing chamber 41 into the chamber 45 and the door 53 has been closed. The second method is to evacuate the chambers 41 and 45 to, for example, about 50 Torr after the wafer W has been transported from the chamber 41 into the chamber 45 and the open/close mechanism 53 has been closed.

After the completion of the reduced-pressure process in the second processing chamber 42, interior of the second processing chamber is purged with $N_2$ gas, adjusting the pressure in the chamber 42 is raised to substantially the same value as the pressure in the second load-locking chamber 44, which is, for example, 50 to 500 Torr. Then, the open/close mechanism 51 is opened. The transport arm 52 is moved, transporting the wafer W from the second processing chamber 42 into the second load-locking chamber 44 through the open/close mechanism 51. Then, the mechanism 51 is closed.

Next, interior of the second load-locking chamber 44 is purged with $N_2$ gas, thus raising the pressure in the chamber 44 is raised to a value equal to or slightly greater than the atmospheric pressure. The open/close mechanism 50 is then opened. The transport arm 52 is moved, transporting the wafer W from the chamber 44 onto the wafer mount 58. Then, the open/close mechanism 50 is closed.

Finally, the arm 23 of the multi-joint robot 22 is manipulated, moving the wafer w back to the original position in the wafer cassette 12.

The route in which the semiconductor W is transported, while being processed as described above, is indicated by the solid lines in FIG. 2.

In the instance described above, the wafer w are continuously subjected to two reduced-pressure processes. Instead, one of these possesses can be selected and carried out. More specifically, as indicated by the one-dot, one-dash lines in FIG. 2, the wafer W may be transported in the same way until it is moved into the third load-locking chamber 45, and then may be transported from the chamber 45 onto the wafer mount 58 after the open/close mechanism 55 is opened. In this case, the wafer W is processed in the first processing chamber 41 only.

In order to process the wafer W in the second processing chamber 42 only, the wafer W is transported as follows in the route indicated by the two-dot, one-dash lines in FIG. 2

The wafer W is moved onto the mount 58 by the arm 23 after the centering of the wafer W and the aligning of the orientation flat thereof have been achieved on the wafer chuck 32. Interior of the third load-locking chamber 45 is purged with $N_2$ gas, raising the pressure in the chamber 45 to a value equal to or slightly greater than the atmospheric pressure. The open/close mechanism 55 is opened, and the transport arm 56 is moved, transporting the wafer W from the wafer mount 58 into the chamber 45. The open/close mechanism 55 is closed, and the second processing chamber 42 and the third load-locking chamber 45 are evacuated to almost the same pressure of, for example, 50 to 500 Torr. The open/close mechanism 54 is opened, and the transport arm 56 is driven, transporting the wafer W from the chamber 45 into the second processing chamber 42. Then, the open/close mechanism 54 is closed. Thereafter, the wafer W is processed in the chamber 42 and transported in the same manner as in the case it is continuously subjected two processes.

The wafer W may be continuously subjected to two processes in the reverse order—that is, it may be processed, first in the second processing chamber 42 and then in the first processing chamber 41. To perform the two reduced-pressure processes on the wafer W in the reverse order, the wafer w is transported as follows in the route indicated by the broken lines in FIG. 2

First, wafer chuck 32 is manipulated, holding the semiconductor wafer W. The sensor (not shown) detects the edge of the wafer W and outputs a signal. In response to this signal, the drive mechanism moves the chuck 32, centering the wafer W and, also, aligning the orientation flat thereof. Then, the arm 23 is moved, transporting the wafer W onto the wafer mount 58. The wafer W is transported into the second load-locking chamber 44, the second processing chamber 42, the third load-locking chamber 45, the first processing chamber 41, and the first load-locking chamber 43—in the order mentioned. Finally, the wafer W is then mounted back onto the wafer mount 58 and is placed at the original position in the wafer cassette 12 by means of the arm 23 of the multi-joint robot 22.

To process the wafer W first in the first processing chamber 41, the wafer W need not always be transported from the wafer chuck 32 into the first load-locking chamber 43 through the open/close mechanism 46. Instead, the wafer W may be transferred from the chuck 32 onto the mount 58 by means of the multi-joint robot 22 and may then be moved into the first load-locking chamber 43 after the open/close mechanism 47 has been opened.

As has been described, in the reduced-pressure processing apparatus of FIG. 1, the wafer W can be transported from the transfer stage 57 into the third load-locking chamber 45, and from the chamber 45 to the infer mount 58, through the open/close mechanism 55. Therefore, the wafer W can be continuously subjected to two reduced-pressure processes in two processing chambers, respectively, or to only one reduced-pressure in one of the processing chambers—also as described above. In addition, since the conditions or method in which to process a wafer w in the first and second processing chambers 41 and 42 can easily be changed, the apparatus shown in FIG. 1 is rich in versatility.

Figure 3:
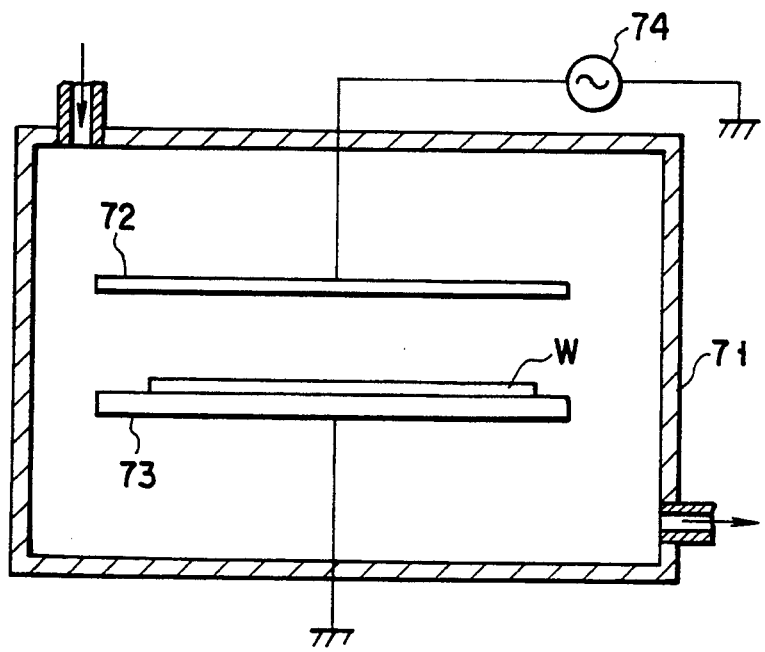
FIG. 3 is a schematic side view of a device located in the first processing chamber of the apparatus shown in FIG. 1.

The processing chambers 41 and 42 may be designed differently for performing two types of reduced-pressure processes, respectively, so that a wafer W may be continuously subjected to two processes. Alternatively, the processing chambers 41 and 42 may be used for performing the same type of a reduced-pressure process, but under different conditions. In this case, too, a wafer W can be continuously subjected to the process, first under a certain condition and then under another condition. For example, a high-power etching may be performed on a wafer W in the first processing chamber 41, and a low-power etching may be performed on the wafer W in the second processing chamber 42, thereby smoothing the surface of the wafer W which has been ion-damaged during the high-power etching. More specifically, the anisotropic etching device shown in FIG. 3 and the isotropic etching device shown in FIG. 4 may be used in combination with the chambers 41 and 42, respectively.

Figure 4:
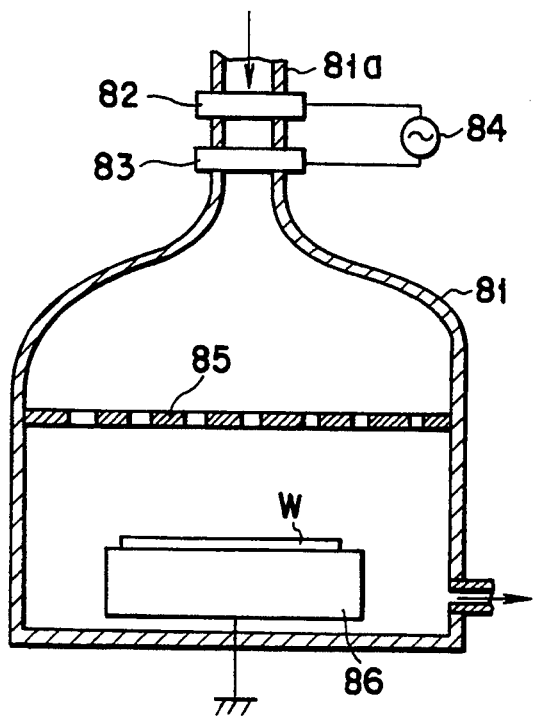
FIG. 4 is a schematic side view of a device located in the second processing chamber of the apparatus shown in FIG. 1.

The anisotropic etching device shown in FIG. 4 comprises a processing chamber 71, an upper electrode 72 located in the chamber 71, a lower electrode 73 located in the chamber 71, and an RF power supply 74 provided outside the chamber 71 for applying an RF power between the electrodes 72 and 73. A semiconductor wafer W as a workpiece, is placed on the lower electrode 73. The lower electrode 73 is connected to the ground, whereas the upper electrode 72 is connected to the RF power supply 74. In operation, the pressure in the chamber 71 is maintained low, and a process gas is introduced into the chamber 71. The RF power is applied between the electrodes 72 and 73, generating plasma of the process gas in the gap between the electrodes 72 and 73. The plasma is applied to the wafer W, effecting anisotropic etching on the wafer W. The device of FIG. 3 can be utilized for anisotropic etching of $SiO_2$, SiN, polysilicon, Al, and the like.

The isotropic etching device shown in FIG. 4 comprises a processing chamber 81 having a gas-inlet portion 81a, a pair of electrodes 82 and 83 wound around the gas-inlet portion 81a, an RF power supply 84 for supplying an RF power to the electrodes 82 and 83, a wafer support 86 contained in the chamber 82 and mounted on the bottom of the chamber 81, and a grid 85 located in the chamber 81 and above the wafer support 86. The grid 85 is an aluminum plate having a plurality of through holes and can trap ions during the etching. The wafer support 86 is connected to the ground. In operation, the pressure in the chamber 81 is maintained low, and a process gas is introduced through the gas-inlet portion 81a into the chamber 81. The RF power is supplied from the RF power supply 84 to the electrodes 82 and 83, converting the gas into plasma as the gas passes by the electrodes 82 and 83. The grid 85 traps the ions in the plasma, and the ion-free plasma is applied to the wafer W placed on the support 86. As a result, isotropic etching is performed on the wafer W. The device of FIG. 4 can be utilized for ashing a resist and removing etching residue.

As has been described, a wafer W may be processed in either the first processing chamber 41 or the second processing chamber 42. If so, a wafer W can be processed in the first chamber 42 under a certain condition, and another wafer W can be processed in the second processing chamber under a different condition, provided that the two process conditions have been set for the processing chambers 41 and 42, respectively. Since the process condition for each processing chamber can be altered greatly, the apparatus has high versatility.

As has been indicated, a wafer w can be continuously subjected to two processes in the processing chambers 41 and 42. If so, as has been described, too, a high-power etching and a low-power etching can be performed in the first processing chamber 41 and the second processing chamber 42, respectively. In this case, the low-power etching can be performed in the second processing chamber 42, prior to the high-power etching to be carried out in the first processing chamber 41.

Besides the advantages pointed out above, other advantages are found in the reduced-pressure processing apparatus illustrated in FIG. 1.

First, the chambers 41, 42, 43, 44 and 45 and the wafer mount 58 are arranged densely, or very close to one another. Hence, the apparatus occupies only a smaller floor space than two apparatus each of which has the processing chamber and load-locking chambers connected to the front and rear of processing chamber, or than a multi-chamber type apparatus which comprises a load-locking chamber necessarily has a great volume and two processing chambers arranged parallel to each other and connected to the load-locking chamber. Obviously, the apparatus shown in FIG. 1 is more suitable for use in a clean the unit floor space of which is very expensive.

Second, since the processing chambers 41 and 42 are located in the two corners of the processing section 40 as is shown in FIG. 1, they can be easily accessed for maintenance work, not bothered with a taller gas-power unit 60. Hence, the reduced-pressure processing apparatus is advantageous in view of safety and maintenance efficiency.

Third, since the chambers 41, 42, 43, 44 and 45 and the wafer mount 58 are arranged as is shown in FIG. 1, the distance for which wafer w is transported from the mount 58 into any load-locking chamber, and the distance for which it is move from each load-locking chamber into the associated processing chamber are short. Hence, the throughput of the apparatus is greater than that of a multi-chamber type apparatus in which the single load-locking chamber is large, inevitably lengthening the distance for which to move a wafer W from the wafer mount into the load-locking chamber, and the distance for which to transport the wafer W from the load-locking chamber into each processing chamber.

Fifth, the yield of processed wafers W can be high, not sacrificing the throughput of the apparatus, for three reasons. First, each wafer W remains well protected from contaminants in the air because any chamber containing a wafer W is pneumatically disconnected from the atmosphere. Secondly, gas flows slowly into each chamber, scarcely dispersing dust or impurities, and the wafer will not be contaminated. Thirdly, the wafer W is transported into either processing chamber through a load-locking chamber, and is thus protected against cross-contamination. By contrast, a multi-chamber type apparatus will have its throughput decreased if such measures as taken in the apparatus of FIG. 1 to achieve a sufficient yield of the processed wafers.

As has been explained, the processing apparatus shown in FIG. 1 can continuously perform two reduced-pressure processes of different types or only one of these processes, can perform these processes in the reverse order, and can continuously perform two reduced-pressure processes of the same type in different conditions or methods—under a relatively simple sequence control. The reduced-pressure processing apparatus, therefore, has high versatility.

Not only being so versatile, the apparatus of FIG. 1 occupies but a minimum floor space in a clean room the unit floor space of which is very expensive. Moreover, the apparatus is easy to maintain. Further, the apparatus has a great throughput because the distance for which to transfer a wafer into any of the chambers is short and also because each load-locking chamber is small. In addition, the apparatus can maintain a high degree of cleanness, not at the expense of its throughput, since each wafer W remains well protected from contaminants in the air, gas flows slowly into each chamber, scarcely dispersing dust or impurities, and the wafer w is protected from cross-contamination.

Figure 5:
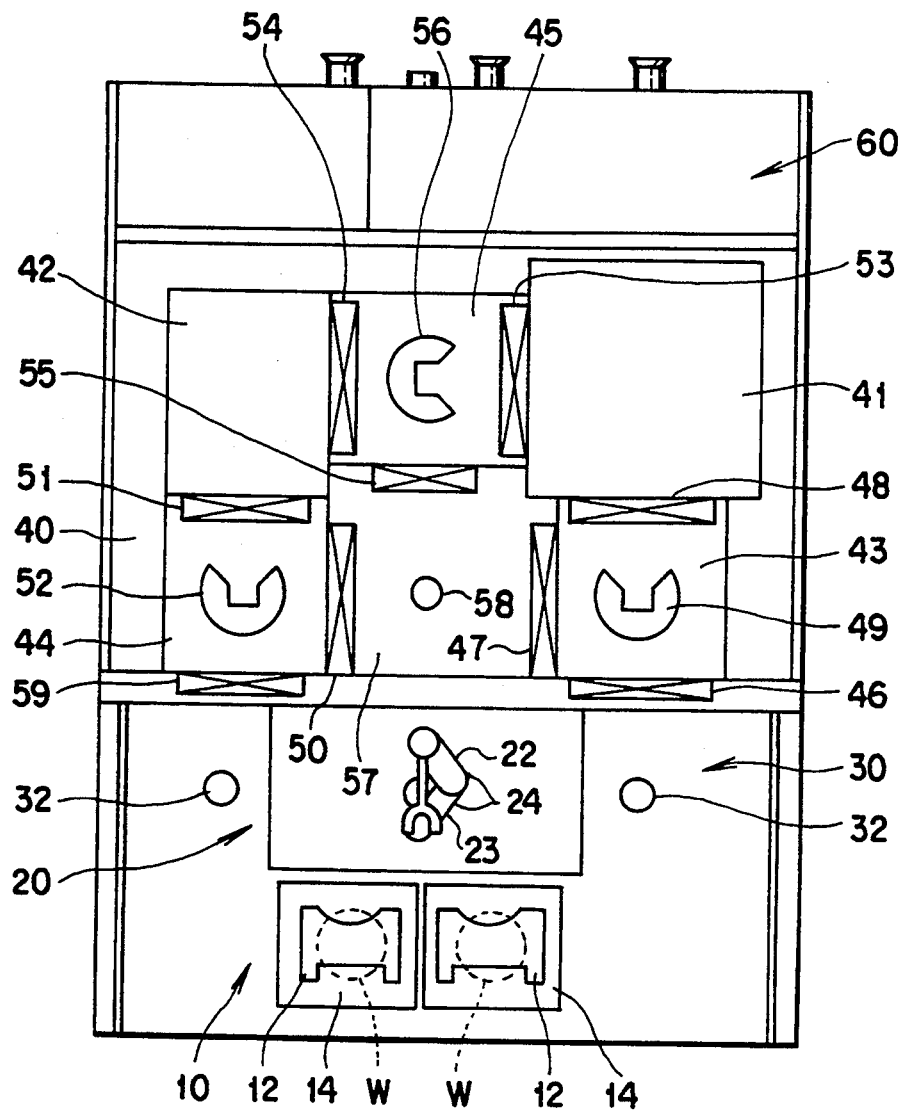
FIG. 5 is a schematic plan view showing a reduced-pressure processing apparatus according to another embodiment of the present invention.

Another reduced-pressure processing apparatus according to the present invention will now be described, with reference to FIG. 5. This apparatus differs from the apparatus of FIG. 1, in that the second load-locking chamber 44 has an open/close mechanism 59 on the side facing the transport section 20 and that two wafer chucks 32 (not one chuck) are located, each at one side of the multi-joint robot 22. In operation, a wafer W can be transported into the second load-locking chamber 44 through the open/close mechanism 59, immediately after it has been aligned by means of the wafer chuck 32. This help enhance the throughput of the apparatus.

Figure 6:
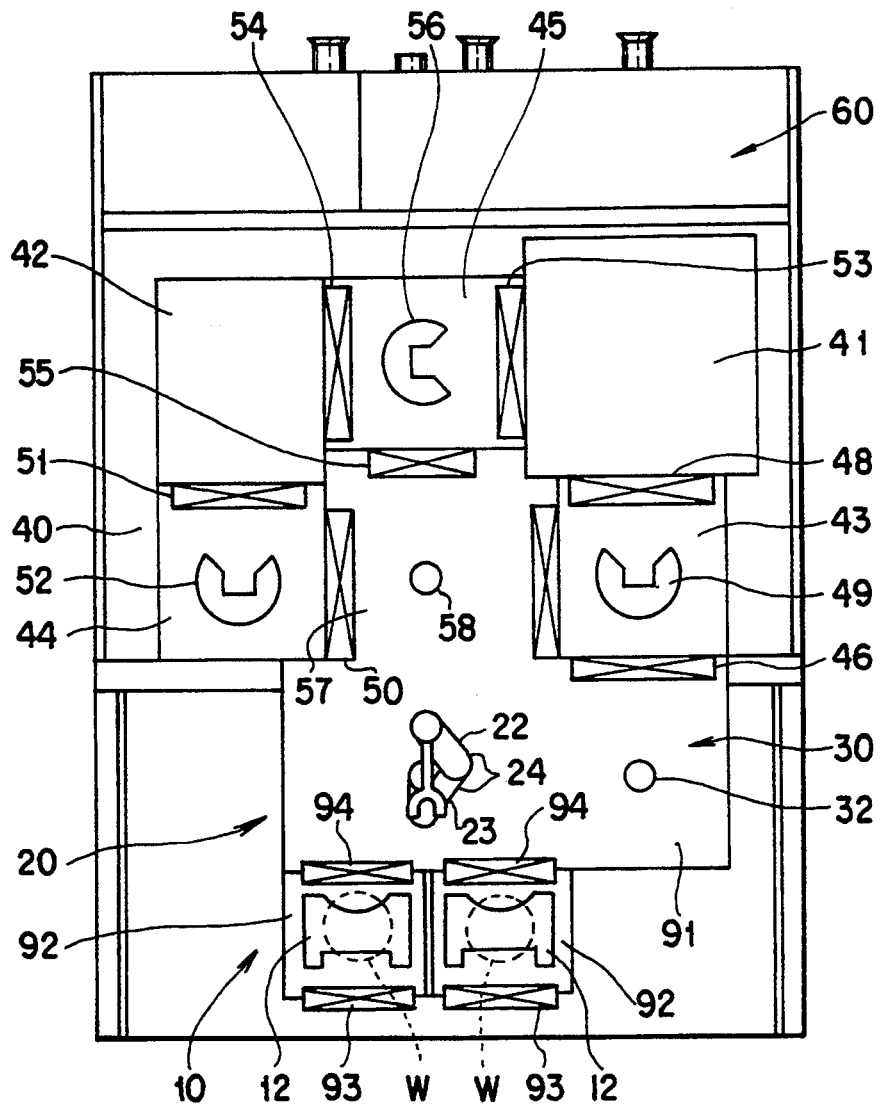
FIG. 6 is a schematic plan view showing a reduced-pressure processing apparatus according to still another embodiment of the present invention.

Still another reduced-pressure processing apparatus according to the present invention will now be described, with reference to FIG. 6. This apparatus is characterized in two respects. First, the transport section 20, the alignment section 30, and the transfer stage 57 are located within a chamber 91 the pressure in which can be reduced. Second, wafer cassettes 12 are placed within a load-locking chamber 92. Due to these structural features, each wafer W can be continuously subjected to two processes in a reduced-pressure atmosphere and can remains more readily protected from contaminants in the air than in the apparatuses of FIGS. 1 and 5. Also, dust or impurities are less dispersed, and the wafer w is better protected from cross-contamination, than in the apparatuses shown in FIGS. 1 and 5.

In the embodiments described above, a wafer w is aligned by means of the wafer chuck 32. Instead, the wafer mount 58 may be designed to hold and align a wafer W, so that the chuck 32 can be dispensed with.

Furthermore, only only etching and ashing, but also any other type of a reduced-pressure process can be performed in the processing chambers 41 and 42. For instance, a first passivation film is formed on a wafer W in the first processing chamber 41 by CVD method, and a second passivation film is formed on the first passivation film in the second processing chamber 41 by CVD method.

Various changes and modifications can be achieved, without departing from the scope and spirit of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A reduced-pressure processing apparatus comprising:
   temporary supporting means for temporarily supporting a workpiece;
   a first processing chamber in which a first process is performed on a workpiece under a reduced pressure;
   a second processing chamber in which a second process is performed on the workpiece under a reduced pressure;
   a first load-locking chamber connected to said first processing chamber, for allowing to be pneumatically disconnected from said first processing chamber, and allowing a passage of a workpiece into and from said first processing chamber and to and from said temporary holding means;
   a second load-locking chamber connected to said second processing chamber, for allowing to be pneumatically disconnected from said second processing chamber, and allowing a passage of a workpiece into and from said second processing chamber and to and from said temporary supporting means; and
   a third load-locking chamber located between said first and second processing chambers and connected thereto, for allowing to be pneumatically disconnected from said first and second processing chambers, and allowing a passage of a workpiece into and from said first and second processing chambers and to and from said temporary supporting means.

2. The apparatus according to claim 1, wherein said first load-locking chamber comprises:
   a chamber body;
   a transport arm for transporting a workpiece into and from said first processing chamber, and to from said temporary holding means;
   first open/close means for opening and closing a boundary portion between said chamber body and said first processing chamber; and
   second open/close means for opening and closing a boundary portion between said chamber body and said temporary supporting means.

3. The apparatus according to claim 2, wherein said second load-locking chamber comprises:
   a chamber body;
   a transport arm for transporting a workpiece into and from said second processing chamber, and to and from said temporary holding means;
   third open/close means for opening and closing a boundary portion between said chamber body and said second processing chamber; and
   fourth open/close means for opening and closing a boundary portion between said chamber body and said temporary supporting means.

4. The apparatus according to claim 3, wherein said third load-locking chamber comprises:
   a chamber body;
   a transport arm for transporting a workpiece into and from said first processing chamber, into and from said second processing chamber, and to and from said temporary holding means;
   fifth open/close means for opening and closing a boundary portion between said chamber body and said first processing chamber;
   sixth open/close means for opening and closing a boundary portion between said chamber body and said second processing chamber; and
   seventh open/close means for opening and closing a boundary portion between said chamber body and said temporary supporting means.

5. The apparatus according to claim 4, wherein said temporary supporting means has a table for temporarily supporting the workpiece, and said first and second processing chambers and said first to third load-locking chamber are arranged, surrounding said table.

6. The apparatus according to claim 5, further comprising transport means for transporting the workpiece from a predetermined position to said table.

7. The apparatus according to claim 6, further comprising a chamber which contains said table and said transport means and which is able to have inner pressure reduced.

8. The apparatus according to claim 6, further comprising alignment means for aligning the workpiece transported from said predetermined position by said transport means.

9. The apparatus according to claim 8, wherein said alignment means has a holding member for holding the workpiece.

10. The apparatus according to claim 9, wherein said holding member of said alignment means is located near said first load-locking chamber and is able to be moved by said transport means to transport the workpiece into and from said first load-locking chamber.

11. The apparatus according to claim 8, wherein said alignment means has a first holding member and a second holding member, both for holding a workpiece, the first holding member is located near said first load-locking chamber and enables said transport means to transport the workpiece into from said first load-locking chamber, and the second holding member is located near said second load-locking chamber and enables said transport means to transport the workpiece into from said second load-locking chamber.

12. The apparatus according to claim 1, wherein said temporary supporting means has alignment means for aligning the workpiece.

13. The apparatus according to claim 1, wherein said first processing chamber comprises an anisotropic etching device, and said second processing chamber comprises an isotropic etching device.

14. A reduced-pressure processing apparatus comprising:

storage means for storing a workpiece;

temporary supporting means for temporarily supporting the workpiece;

transporting means for transporting the workpiece between said storage means and said temporary supporting means;

a first processing chamber in which a first process is performed on the workpiece under a reduced pressure;

a second processing chamber in which a second process is performed on the workpiece;

a first load-locking chamber connected to said first processing chamber;

a second load-locking chamber connected to said second processing chamber; and a third load-locking chamber connected to said first and second processing chambers, wherein each of said load-locking chambers is capable of being disconnected from an adjacent one or both of said processing chambers and has a transfer mechanism for transferring the workpiece to and from said temporary supporting means and the adjacent one or both of said processing chambers.

* * * * *